United States Patent
Xu et al.

(10) Patent No.: US 9,843,326 B1
(45) Date of Patent: Dec. 12, 2017

(54) WIDE RANGE LEVEL SHIFTER FOR LOW VOLTAGE INPUT APPLICATIONS

(71) Applicant: GLOBALFOUNDRIES Singapore Pte. Ltd., Singapore (SG)

(72) Inventors: Fei Xu, Singapore (SG); On Auyeung, Singapore (SG); Qi Chen, Singapore (SG); Zhihong Luo, Singapore (SG); Sui Chor Benjamin Lau, South San Francisco, CA (US); Bai Yen Nguyen, Union City, CA (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/227,979

(22) Filed: Aug. 4, 2016

(51) Int. Cl.
*H03L 5/00* (2006.01)
*H03K 19/0948* (2006.01)

(52) U.S. Cl.
CPC ............... *H03K 19/0948* (2013.01)

(58) Field of Classification Search
CPC .................................. H03K 19/0948
See application file for complete search history.

(56) References Cited

U.S. PATENT DOCUMENTS

| 6,515,532 B2 * | 2/2003 | Jinzai | H03K 19/018521 326/83 |
| 6,819,159 B1 * | 11/2004 | Lencioni | H03K 3/356113 326/81 |
| 7,368,970 B2 * | 5/2008 | Lin | H03K 3/356113 326/62 |

* cited by examiner

Primary Examiner — Kenneth B Wells
(74) Attorney, Agent, or Firm — Horizon IP Pte. Ltd.

(57) ABSTRACT

Device and a method of configuring a voltage level shifter is disclosed. The device includes a traditional level shifter circuit (TLSC), a first control circuit (FCC) cross-coupled to a second control circuit (SCC). The FCC is coupled to receive an inverse of an input at a first input node and provide a first output at a first output node. The SCC is coupled to receive the input at a second input node and provide a second output at a second output node and the TLSC is configured to provide an output at an output node in response to the first output received at the first output node and the second output received at the second output node. A first power source is configured to provide a first power supply voltage to the TLSC, the FCC and the SCC. The output is latched to track the input. The TLSC, the FCC and the SCC are coupled to a ground reference node.

19 Claims, 4 Drawing Sheets

| SWITCH | IN = VDDL 174 | IN VDDL->LOW 176 | IN = LOW 178 | IN LOW -> VDDL 158 |
|---|---|---|---|---|
| IN 140 | VDDL | VDDL->LOW | LOW | LOW->VDDL |
| INB 142 | LOW | LOW -> VDDL | VDDL | VDDL->LOW |
| OUT 170 | VDDH | VDDH->LOW | LOW | LOW->VDDH |
| N1 188 | LOW | LOW -> VDDH | VDDH | VDDH -> LOW |
| INH 152 | VDDH | VDDH->LOW | LOW | LOW->VDDH |
| NINH 164 | LOW | LOW -> VDDH | VDDH | VDDH -> LOW |
| MN1 116 | ON | ON->OFF | OFF | OFF->ON |
| MN2 118 | OFF | OFF->ON | ON | ON->OFF |
| MN3 122 | OFF | OFF->ON | ON | ON->OFF |
| MN4 132 | ON | ON->OFF | OFF | OFF->ON |
| MN5 184 | OFF | OFF->ON->OFF | OFF | OFF |
| MN6 186 | OFF | OFF | OFF | OFF->ON->OFF |
| MP1 112 | OFF | OFF->ON | ON | ON->OFF |
| MP2 114 | ON | ON->OFF | OFF | OFF->ON |
| MP3 128 | ON | ON->OFF | OFF | OFF->ON |
| MP4 138 | OFF | OFF->ON | ON | ON->OFF |
| MP5 124 | ON | ON->UNKNOWN | UNKNOWN | UNKNOWN->ON |
| MP6 126 | ON | ON->UNKNOWN | UNKNOWN | UNKNOWN->ON |
| MP7 134 | UNKNOWN | UNKNOWN->ON | ON | ON->UNKNOWN |
| MP8 136 | UNKNOWN | UNKNOWN->ON | ON | ON->UNKNOWN |

Figure 1C

WIDE RANGE LEVEL SHIFTER FOR LOW VOLTAGE INPUT APPLICATIONS

BACKGROUND

With advances of semiconductor technology into the nano scale, it is common to scale down the power supply voltage to match the power domain requirements of the scaled down transistors. For example, many core logic chips are now configured to operate at sub-one volt power supply voltage. However, many peripheral sub-systems like input/output (I/O) and memory chips may be configured to operate at higher power supply voltages. System-on-chip (SOC) designs typically include multiple power domains to power multiple core logic chips and sub-systems integrated on a single chip. A level shifter circuit is configured to interface between two power domains having different voltage and power characteristics. A voltage level shifter circuit typically converts a digital signal from one logic standard to another.

Traditional voltage level circuits may not operate properly in low input voltage applications since the low input voltage may be insufficient to change the latched state of the level shifter. Attempts to lower the threshold voltage of the input transistor may result in reduced reliability of the drain node of the input transistor since the transistor may not withstand a large voltage difference applied between its drain and other nodes.

From the foregoing discussion, it is desirable to provide tools and techniques to improve performance, reliability and lower cost of a voltage level shifter configured to handle very low input voltages.

SUMMARY

Embodiments generally relate to a device and method of configuring an integrated circuit chip that provides a voltage shifting function. In one embodiment, a device is disclosed. The device includes a traditional level shifter circuit (TLSC), a first control circuit (FCC) cross-coupled to a second control circuit (SCC). The FCC is coupled to receive an inverse of an input at a first input node and provide a first output at a first output node. The SCC is coupled to receive the input at a second input node and provide a second output at a second output node and the TLSC is configured to provide an output at an output node in response to the first output received at the first output node and the second output received at the second output node. A first power source is configured to provide a first power supply voltage to the TLSC, the FCC and the SCC. The output is latched to track the input. The TLSC, the FCC and the SCC are coupled to a ground reference node.

In yet another embodiment, a method to configure a voltage level shifting device is disclosed. A first control circuit (FCC) is configured to shift a voltage level of an inverse of an input operating between a second power supply voltage and a ground reference to a first output operating between a first power supply voltage and the ground reference. A second control circuit (SCC) is configured to shift the voltage level of the input to a second output operating between the first power supply voltage and the ground reference, where the second output is an inverse of the first output. A traditional level shifter circuit (TLSC) is configured to receive the first output and the second output and generate an output, where the output is operable to track the input, the output operating between the first power supply voltage and the ground reference.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1C shows in tabular form operating states of transistor switches included in a device described with reference to FIGS. 1A and 1B in response to changes in an input.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, and/or components for forming modules, sub-assemblies and assemblies assembled in accordance with a structure for an apparatus may be implemented using various materials and coupling techniques, depending on the application requirements.

Descriptive and directional terms used in the written description such as top, bottom, left, right, upstream, downstream, and similar others, refer to the drawings themselves as laid out on the paper and not to physical limitations of the disclosure unless specifically noted. The accompanying drawings may not be drawn to scale and some features of embodiments shown and described herein may be simplified or exaggerated for illustrating the principles, features, and advantages of the disclosure.

Embodiments generally relate to devices, such as semiconductor devices or integrated circuits (ICs). Other types of devices may also be useful. The devices can be any type of IC, such as SOC. The devices can be incorporated into, for example, consumer electronic products, such as computers, cell phones, wireless electronic devices like watches, cameras and printers, and several types of tablet computing devices. Incorporating the devices in other applications may also be useful.

Figure 1A:
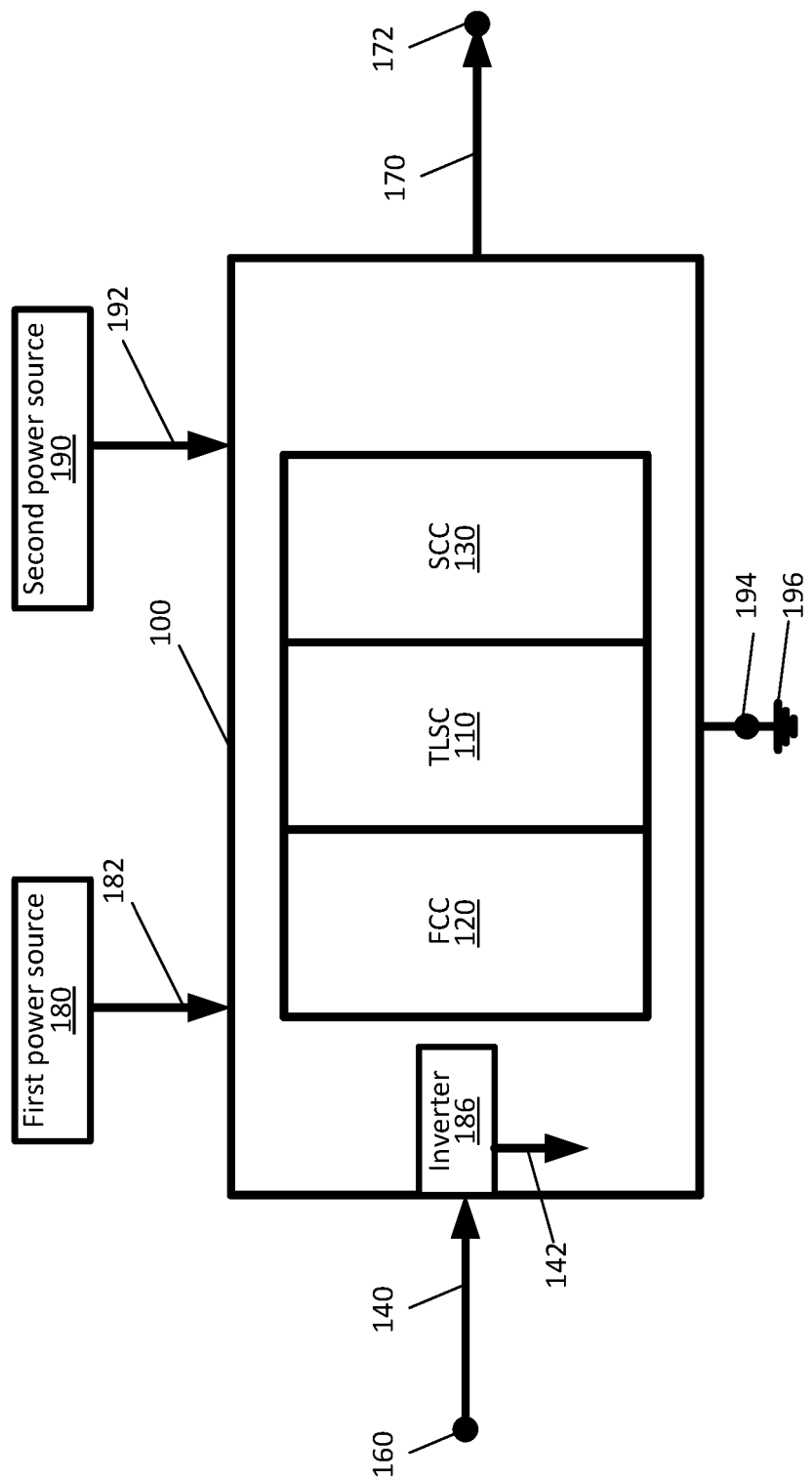
FIG. 1A shows a simplified block circuit diagram of an embodiment of a device configured to provide voltage level shifting.

FIG. 1A shows a simplified block circuit diagram of an embodiment of a device 100 configured to provide voltage level shifting. In the depicted embodiment, the device 100 is configured to receive an input 140 at a second input node (IN) 160 and provide an output 170 at an output node (OUT) 172 in response to the input 140. A first power source 180 is configured to provide a first power supply voltage (VDDH) 182 and a second power source 190 is configured to provide a second power supply voltage (VDDL) 192 to the device 100. The device is coupled to a ground reference node 194 having a reference voltage VSS 196 of approximately 0 volts.

In an embodiment, the input 140 may be configured to switch between the second power supply voltage (VDDL) 192 and the ground reference node voltage 194 and the output 170 may be configured to switch between the first power supply voltage (VDDH) 182 and the ground reference node voltage 194. In an embodiment, the output 170 is latched to track the input 140.

In the depicted embodiment which will be described in more detail with reference to FIG. 1B, the device 100 may be configured to include: a) a traditional level shifter circuit (TLSC) 110, b) a first control circuit (FCC) 120 that is cross-coupled to a second control circuit (SCC) 130, and c) an inverter 186 that may be configured to invert the input 140 to INB 142. As described earlier, in a conventional level shifter circuit (not shown) an input (e.g., IN 140) is directly connected to a differential pair of input transistors (not shown). The technique of directly connecting the input to the differential pair of input transistors may not operate properly in low supply voltage (e.g., VDDL 192) applications since the low supply voltage may be insufficient to change the latched state.

In the depicted embodiment, the FCC 120 and the SCC 130 may be configured to advantageously boost the voltage level of the INB 142 input and the IN 140 input respectively up to VDDH 182 level first before the boosted voltage level is provided as input to the TLSC 110. By boosting the voltage level, the drive strength of the TLSC 110 input pair may be easily matched to the cross-coupled pair, and the latched state of OUT 170 may be easily changed to follow the input IN 140 logic change. Additional details of the TLSC 110, the FCC 120 and the SCC 130 blocks are described with reference to FIGS. 1B and 1C.

Figure 1B:
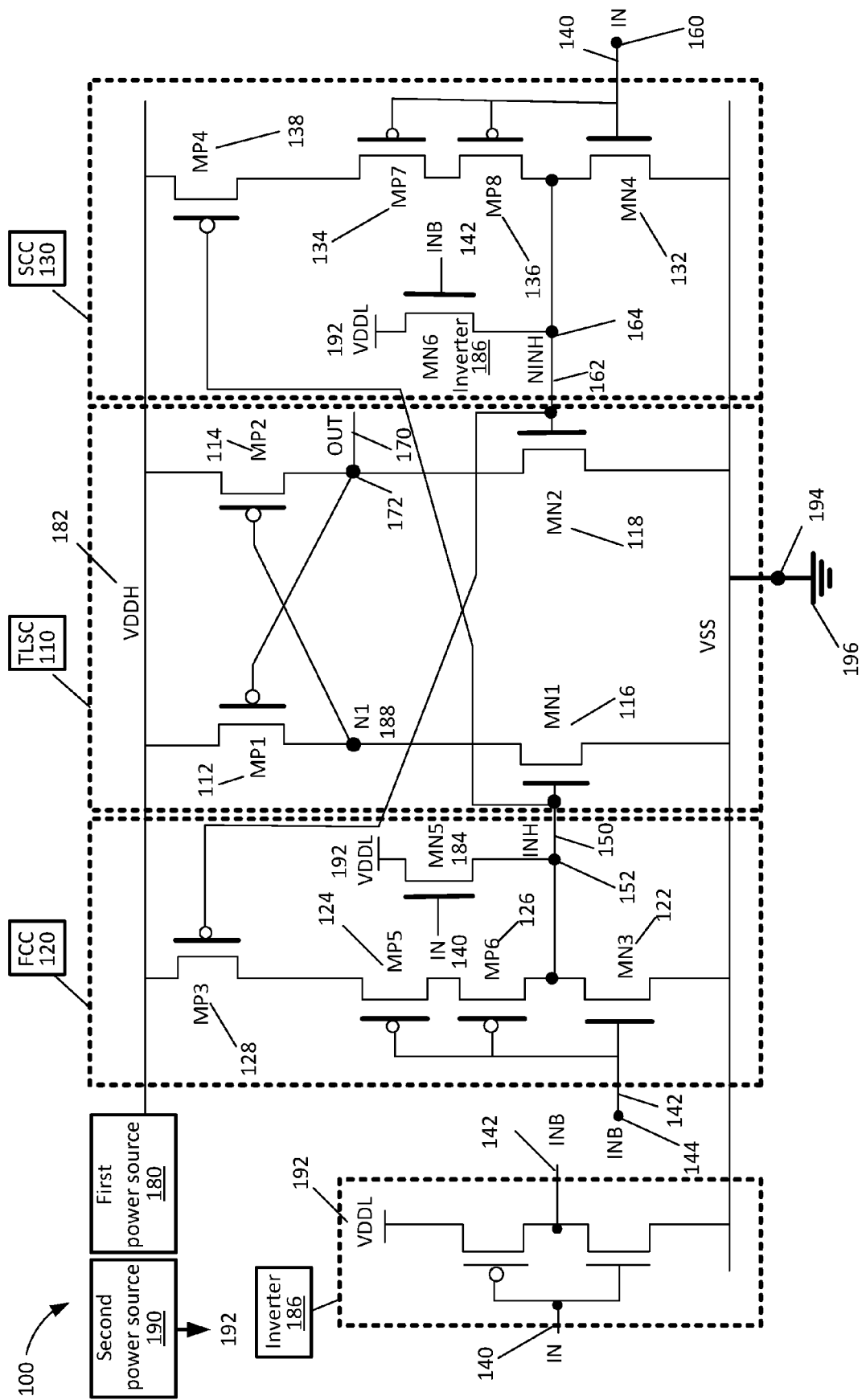
FIG. 1B shows a simplified block circuit diagram illustrating additional details of a device described with reference to FIG. 1A.

FIG. 1B shows a simplified block circuit diagram illustrating additional details of the device 100 described with reference to FIG. 1A. In the depicted embodiment, the device 100 includes the traditional level shifter circuit (TLSC) 110 and the first control circuit (FCC) 120 that is cross-coupled to the second control circuit (SCC) 130. The inverter 186 may be configured to invert the input 140 to INB 142. The FCC 120 is coupled to receive the inverse (INB) 142 of the input 140 at a first input node 144 and provide a first output 150 at a first output node (INH) 152. The SCC 130 is coupled to receive the input IN 140 at the second input node 160 and provide a second output 162 at a second output node (NINH) 164. The TLSC 110 is configured to provide the output 170 at the output node 172 in response to the first output 150 received at the first output node 152 and the second output 162 received at the second output node (NINH) 164 which are generated in response to INB 142 and IN 140 respectively.

The first power source 180 is configured to provide the first power supply voltage (VDDH) 182 to the TLSC 110, the FCC 120 and the SCC 130. The second power source 190 is configured to provide a second power supply voltage (VDDL) 192 to the inverter 186, the FCC 120 and the SCC 130. The TLSC 110, the FCC 120, the SCC 130 and the inverter 186 are coupled to the ground reference node 194.

In the depicted embodiment, the FCC 120 includes a MN3 122 transistor having a gate coupled to receive the inverse INB 142 of the input 140 at the first input node 144, where an operating state of the MN3 122 transistor is switched in response to the inverse INB 142 of the input 140. The FCC 120 also includes a pair of MP5 124 and MP6 126 transistors coupled in series, where respective gates of the MP5 124 and MP6 126 transistors are coupled to receive the inverse INB 142 of the input 140 at the first input node 144. A drain of the MP6 126 transistor is coupled to a drain of the MN3 122 transistor to form the first output node 152. A MP3 128 transistor has a gate that is coupled to receive the second output 162 at the second output node 164 and a source of the MP3 128 transistor is coupled to the first power source 180 and a drain of the MP3 128 transistor is coupled to a source of the MP5 transistor 124. A MN5 184 transistor has a gate coupled to receive the input 140 at the second input node 160, a source of the MN5 184 transistor is coupled to the first output node (INH) 152, and a drain of the MN5 184 transistor is coupled to the second power source 190.

Similarly, the SCC 130 is configured to include a MN4 132 transistor having a gate coupled to receive the input 140 at the second input node 160, where an operating state of the MN4 132 transistor is switched in response to the input 140. A pair of MP7 134 and MP8 136 transistors coupled in series, where respective gates of the MP7 134 and MP8 138 transistors are coupled to receive the input 140 at the second input node 160, and a drain of the MP8 136 transistor is coupled to a drain of the MN4 132 transistor to form the second output node (NINH) 164. A MP4 138 transistor has a gate coupled to receive the first output 150 at the first output node (INH) 152, a source of the MP4 138 transistor is coupled to the first power source 180, and a drain of the MP4 138 transistor is coupled to a source of the MP7 134 transistor. A MN6 186 transistor has a gate coupled to receive the inverse (INB) 142 of the input 140 at the first input node 144, a source of the MN6 186 transistor is coupled to the second output node (NINH) 164, and a drain of the MN6 186 transistor is coupled to the second power source 190.

In the depicted embodiment, the TLSC 110 includes a pair of cross-coupled MP1 112 and MP2 114 transistors, where a gate of the MP1 112 transistor is coupled to a drain of the MP2 114 transistor forming output 170 at the output node 172, a gate of the MP2 114 transistor is coupled to a drain of the MP1 112 transistor forming N1 188 node and source of MP2 114 transistor and source of MP1 112 transistor are coupled to the first power source 180. The TLSC 110 also includes a differential pair of MN1 116 and MN2 118 'input' transistors, where the MN1 116 transistor has a gate coupled to receive the first output 150 at the first output node 152, a source of the MN1 116 transistor is coupled to the ground reference node 194, and a drain of the MN1 116 transistor is coupled to a drain of the MP1 112 transistor. Similarly, the MN2 118 transistor has a gate coupled to receive the second output (NINH) 162 at the second output node 164, a source of the MN2 118 transistor is coupled to the ground reference node 194, and a drain of the MN2 118 transistor is coupled to a drain of the MP2 114 transistor.

As described earlier, the input 140 may be switched from one logic state (e.g., logic high) to another logic state (e.g., logic low or LOW) and the device 100 having output 170 is configured to track the change. In an embodiment, if input 140 is switched from the VDDL 192 voltage level to a low voltage level, e.g., VSS 196, then the device 100 responds to the switch by performing a sequence of operations to provide an output 170 that tracks the input 140 by switching from the VDDH 182 voltage level to the low voltage level such as LOW or VSS 196.

In an embodiment, the sequence of operations performed by the device 100 may include: A) The inverter 186 generates the INB 142 to switch in inverse of the input 140 (e.g., switch from low level voltage to the VDDL 192 voltage. B) Transistors MN3 122, MN4 132, MP5 through MP8 (124 through 136) are triggered first since they are directly coupled to IN 140 or INB 142. C) Transistor MN3 122 is turned on, MP5 124 and MP6 126 weaken the pull up strength, and the first output node (INH) 152 is rapidly pulled lower. D) Transistor MN4 132 is turned off, MP7 134 and MP8 136 are ready to be turned on. Pull up transistor MN6 186 pulls up the voltage of the second output node (NINH) 164, which lowers the MP3 128 drive strength (due to cross coupling). A lower first output node (INH) 152 assists to pull up the second output node (NINH) 164 through MP4 138, MP7 134 and MP8 136 path. The positive feedback (cross coupling technique) drives INH 152 and NINH 164 nodes to rapidly reach LOW and VDDH voltage levels respectively. E) When INH 152 and NINH 164 nodes are switching, MN1 116 starts to turn off, MN2 118 starts to turn on, OUT 170 is pulled lower, N1 188 is pulled higher. Subsequently, MP1 112 and MP2 114 pair starts the positive feedback due to cross coupling. F) Finally, MN1 116 and MN2 118 reach the steady state, followed by MP1 112 and MP2 114, then N1 188 reaches VDDH voltage level and OUT 170 reaches LOW voltage level. Thus, the high to low switching of IN 140 (e.g., from VDDL to LOW) is successfully tracked by the device 100 by generating the OUT 170 shifted from VDDH to LOW voltage level.

In an embodiment, the input 140 may be switched in reverse from the operation described earlier, e.g., switched from one logic state (e.g., logic low or LOW) to another logic state (e.g., logic high) and the device 100 having output 170 is configured to track the change. In an embodiment, if input 140 is switched from the low voltage level, e.g., VSS 196, to the VDDL 192 voltage level then the device 100 responds to the switch by performing a sequence of operations to provide an output 170 that tracks the input 140 by switching from the low voltage level such as LOW or VSS 196 to the VDDH 182 voltage.

In an embodiment, the sequence of operations performed by the device 100 may include: A) The inverter 186 generates the INB 142 to switch in inverse of the input 140 (e.g., switch from the VDDL 192 to low level voltage. B) Transistors MN3 122, MN4 132, MP5 through MP8 (124 through 136) are triggered first since they are directly coupled to IN 140 or INB 142. C) Transistor MN4 132 is turned on, MP7 134 and MP8 136 weaken the pull up strength, and the second output node (NINH) 162 is rapidly pulled lower. D) Transistor MN3 122 is turned off, MP5 124 and MP6 126 are ready to be turned on. Pull up transistor MN5 184 pulls up the voltage of the first output node (INH) 152, which lowers the MP4 138 drive strength (due to cross coupling). A lower second output node (NINH) 164 assists to pull up the first output node (INH) 152 through MP3 128, MP5 124 and MP6 126 path. The positive feedback (cross coupling technique) drives INH 152 and NINH 164 nodes to rapidly reach VDDH and LOW voltage levels respectively. E) When INH 152 and NINH 164 nodes are switching, MN2 118 starts to turn off, MN1 116 starts to turn on, OUT 170 is pulled higher, N1 188 is pulled lower. Subsequently, MP1 112 and MP2 114 pair starts the positive feedback due to cross coupling. F) Finally, MN1 116 and MN2 118 reach the steady state, followed by MP1 112 and MP2 114, then N1 188 reaches LOW voltage level and OUT 170 reaches VDDH voltage level. Thus, the low to high switching of IN 140 (e.g., from VDDL to LOW) is successfully tracked by the device 100 by generating the OUT 170 shifted from LOW to VDDH voltage level.

FIG. 1C shows in tabular form operating states of transistor switches included in the device 100 described with reference to FIGS. 1A and 1B responsive to changes in an input. Table 102 includes 20 rows corresponding to various transistor switches or nodes of the device 100. Column 174 indicates an operating state of each of the transistor switch or node when IN 140 is equal to VDDL voltage level. Column 176 indicates an operating state of each of the transistor switch or node when IN 140 is transitioning from VDDL voltage level to LOW voltage level (e.g., during a falling edge). Column 178 indicates an operating state of each of the transistor switch or node when IN 140 is equal to LOW voltage level. Column 158 indicates an operating state of each of the transistor switch or node when IN 140 is transitioning from LOW voltage level to VDDL voltage level (e.g., during a rising edge).

Figure 2:
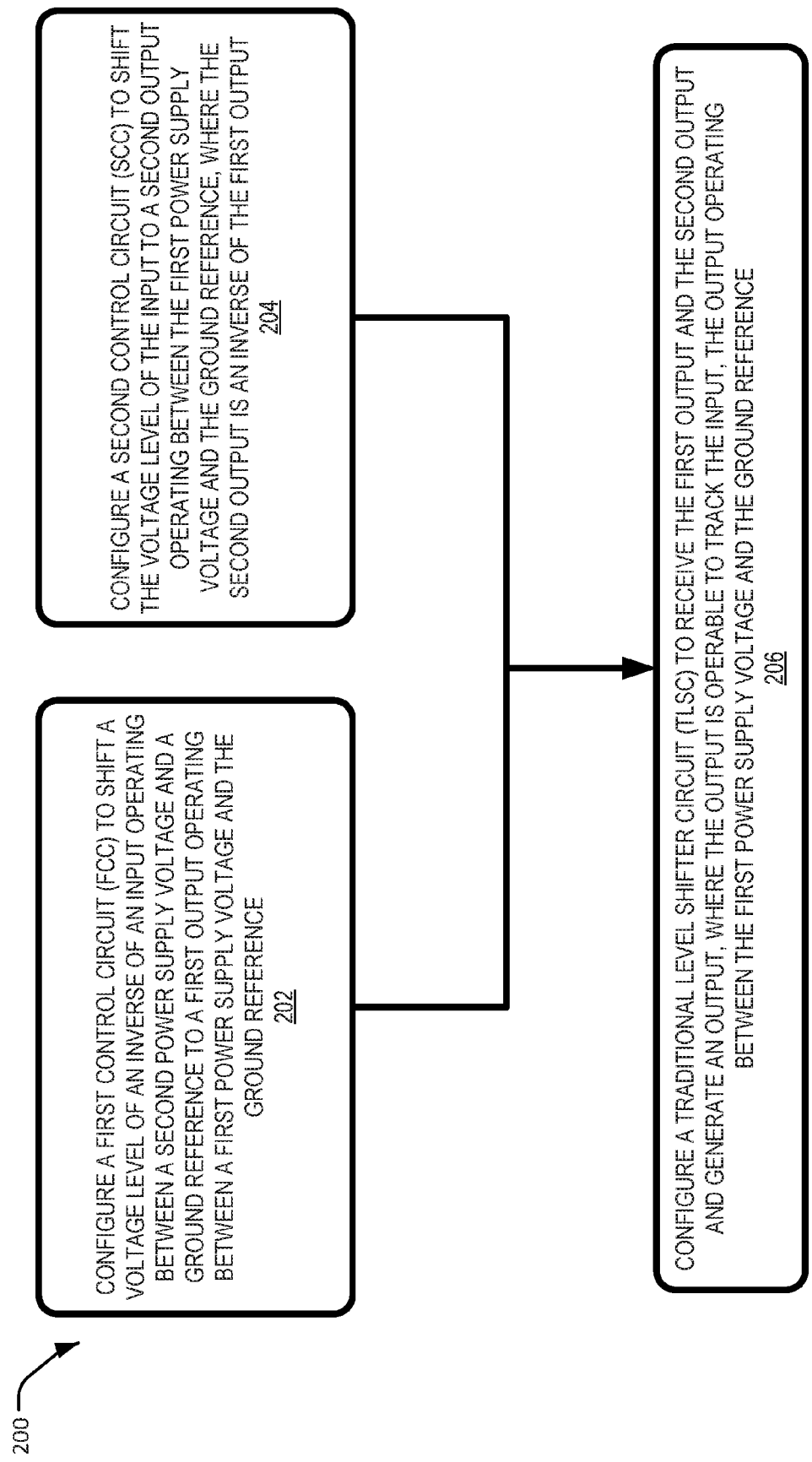
FIG. 2 is a flow diagram illustrating a process to configure a device described with reference to FIGS. 1A, 1B and 1C.

FIG. 2 is a flow diagram illustrating a process 200 to configure a device 100 described with reference to FIGS. 1A, 1B and 1C. The process 200 begins at operation 202 when a first control circuit (FCC) is configured to shift a voltage level of an inverse of an input operating between a second power supply voltage and a ground reference to a first output operating between a first power supply voltage and the ground reference. At operation 204, a second control circuit (SCC) is configured to shift the voltage level of the input to a second output operating between the first power supply voltage and the ground reference, where the second output is an inverse of the first output. In the depicted embodiment, operation 204 may be performed in parallel with operation 202. At operation 206, a traditional level shifter circuit (TLSC) is configured to receive the first output and the second output and generate an output, where the output is operable to track the input, the output operating between the first power supply voltage and the ground reference.

The order in which any process or method described herein is not intended to be construed as a limitation, and any number of the described process blocks can be combined in any order to implement the process, method or alternate method. Additionally, individual blocks may be deleted from the process without departing from the spirit and scope of the subject matter described herein. Furthermore, the process may be implemented in any suitable hardware, software, firmware, or a combination thereof, without departing from the scope of the invention.

The embodiments as described above result in advantages. In very low VDDL applications, a conventional or traditional level shifter circuit may not function properly since a threshold voltage of the thick-gate transistor is very close to the low VDDL, the input transistors (e.g., MN1 and MN2) are too weak to change the latched state. Thin-gate input transistors may not be used as the input pair to shift the voltage due to reliability concerns on the drain node. Thus, in a traditional voltage shifter circuit having acceptable MN1 and MN2 vs MP1 and MP2 ratio may limit their usefulness. The device 100 does not have sizing requirements when compared to the traditional circuit. Transistors MN3 122 and MN4 132 may be configured to have moderate channel width to length (W/L) ratio to pull the INH and NINH nodes low enough when VDDL is very low.

In a conventional or traditional level shifter, the input is directly connected to the differential pair of input transistors (e.g., MN1 and MN2). The device 100 advantageously boosts the input (IN) voltage up to VDDH level first, so that the drive strength of the input pair transistors (MN1 and MN2) and cross-coupled transistors (MP1 and MP2) may be easily matched, so that the latched state of OUT may be easily changed to follow the input signal logic change. Matching the drive strength of the input pair of transistors and the cross-coupled pair of transistors of the TLSC advantageously reduces voltage stress on the input pair of transistors.

In addition, the device 100 is fully operational in much lower VDDL applications. For example, VDDL voltage levels may be approximately 0.2V lower than the conventional or traditional circuit with the same VDDH. In one embodiment, simulated results using commercially available simulation tools indicate that the conventional or traditional circuit failed to operate normally (e.g., failed to latch the input) when VDDL is 0.8V or below. However, the same simulation tools demonstrated that the device 100 was fully operational when VDDL was between 1.1V to 0.7V. Thus, the device 100 advantageously provides increased lower range of VDDL (e.g., VDDL (nominal) −30% or more) compared to traditional or conventional level shifter which typically has VDDL range of VDDL (nominal) −10%.

The device 100 advantageously supports wide range VDDH applications. That is, the device 100 is operational for different VDDH levels at the same VDDL, for example, VDDH (nominal) may be 1.8V, 2.5V and 3.3V. Since device 100 does not include any resistor or capacitor devices or other type of transistors like LVT devices, no extra mask layer may be required which reduces cost and improves reliability. In addition, unlike traditional voltage shifter designs, there is no need to add cascode transistors with gates connected to a bias voltage to reduce reliability concerns when using thin-gate transistor as input pair. This further saves fabrication cost and lowers the design complexity of the chip.

Although the embodiments described above use complementary metal oxide (CMOS) technology to fabricate the transistor switches used in device 100, other types of transistor switches such as metal-oxide-semiconductor field-effect-transistors (MOSFETs) and field effect transistor (FET) technology based transistor switches may be useful. Also as described herein voltage levels such as VDDH, VDDL, LOW, VSS and others may be dependent on factors such as technology used, application type (e.g., core logic versus input/output, etc.) and others. In an embodiment, voltage levels for VDDH in an IO application may include 1.8V, 2.5V, 3.3V and others. Voltage levels for VDDL may include 1.2V or 1.1V. As described herein, much lower VDDL means the VDDL voltage level of the device 100 may be much lower than the VDDL of a traditional voltage shifter circuit. Very low VDDL means the VDDL is very low, e.g., 0.7V. For normal operation of the device 100, it is desirable that VDDL minimum level should not be less than the MN3 122 and MN4 124 threshold voltage (Vt).

The term "techniques," for instance, may refer to one or more devices, apparatuses, systems, methods, and articles of manufacture, as indicated by the context described herein. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
a level shifter circuit (LSC);
a first control circuit (FCC) cross-coupled to a second control circuit (SCC), wherein the FCC is coupled to receive an inverse of an input at a first input node and provide a first output at a first output node, wherein the SCC is coupled to receive the input at a second input node and provide a second output at a second output node, wherein the LSC is configured to provide an output at an output node in response to the first output received at the first output node and the second output received at the second output node;
a first power source configured to provide a first power supply voltage to the LSC, the FCC and the SCC; and
a second power source configured to provide a second power supply voltage to the FCC and the SCC, wherein the output is latched to track the input, wherein the LSC, the FCC and the SCC are coupled to a ground reference node.

2. The device of claim 1, wherein the FCC is configured to switch the first output between the first power supply voltage and the ground reference node voltage in response to the inverse of the input switching between the ground reference node voltage and the second power supply voltage.

3. The device of claim 2, wherein the SCC is configured to switch the second output between the ground reference voltage and the first power supply voltage in response to the input switching between the second power supply voltage and the ground reference node voltage.

4. The device of claim 2, wherein the output is configured to switch between the first power supply voltage and the ground reference node voltage in response to the input switching between the second power supply voltage and the ground reference node voltage.

5. The device of claim 2, further comprising:
an inverter circuit powered by the second power source, wherein the inverter circuit is configured to generate the inverse of the input in response to receiving the input.

6. The device of claim 2, wherein the FCC further comprises:
a third (MN3) n-channel transistor having a gate coupled to receive the inverse of the input at the first input node, wherein an operating state of the MN3 transistor is switched in response to the inverse of the input;
a pair of fifth (MP5) and sixth (MP6) p-channel transistors coupled in series, wherein respective gates of the MP5 and MP6 transistors are coupled to receive the inverse of the input at the first input node, wherein a drain of the MP6 transistor is coupled to a drain of the MN3 transistor to form the first output node;
a third (MP3) p-channel transistor having a gate coupled to receive the second output at the second output node, wherein a source of the MP3 transistor is coupled to the first power source, wherein a drain of the MP3 transistor is coupled to a source of the MP5 transistor; and
a fifth (MN5) n-channel transistor having a gate coupled to receive the input at a third input node, wherein a source of the MN5 transistor is coupled to the first output node, wherein a drain of the MN5 transistor is coupled to the second power source.

7. The device of claim 6, wherein the second power supply voltage is configured to be at least equal to a threshold voltage of the MN3 transistor, wherein the MN5 transistor is configured to speed up response of the output in response to a change in the input.

8. The device of claim 2, wherein the SCC further comprises:
a fourth (MN4) n-channel transistor having a gate coupled to receive the input at the second input node, wherein an operating state of the MN4 transistor is switched in response to the input;
a pair of seventh (MP7) and eighth (MP8) p-channel transistors coupled in series, wherein respective gates of the MP7 and MP8 transistors are coupled to receive the input at the second input node, wherein a drain of the MP8 transistor is coupled to a drain of the MN4 transistor to form the second output node;
a fourth (MP4) p-channel transistor having a gate coupled to receive the first output at the first output node, wherein a source of the MP4 transistor is coupled to the first power source, wherein a drain of the MP4 transistor is coupled to a source of the MP7 transistor; and
a sixth (MN6) n-channel transistor having a gate coupled to receive the inverse of the input at the fourth input node, wherein a source of the MN6 transistor is coupled to the second output node, wherein a drain of the MN6 transistor is coupled to the second power source.

9. The device of claim 8, wherein the second power supply voltage is configured to be at least equal to a threshold voltage of the MN4 transistor, wherein the MN6 transistor is configured to speed up response of the output in response to a change in the input.

10. The device of claim 1, wherein the LSC comprises:
a pair of cross-coupled first (MP1) and second (MP2) p-channel transistors, wherein a gate of the MP1 transistor is coupled to the output node, wherein a gate of the MP2 transistor is coupled to a drain of the MP1 transistor, wherein a source of the MP1 and MP2 transistors is coupled to the first power source; and
a differential pair of first (MN1) and second (MN2) n-channel transistors, wherein
the MN1 transistor having a gate coupled to receive the first output at the first output node, wherein a source of the MN1 transistor is coupled to the ground reference node, wherein a drain of the MN1 transistor is coupled to a drain of the MP1 transistor, and
the MN2 transistor having a gate coupled to receive the second output at the second output node, wherein a source of the MN2 transistor is coupled to the ground reference node, wherein a drain of the MN2 transistor is coupled to a drain of the MP2 transistor.

11. A device comprising a level shifter circuit (LSC);
a first control circuit (FCC) cross-coupled to a second control circuit (SCC), wherein the FCC is coupled to receive an inverse of an input at a first input node and provide a first output at a first output node, wherein the SCC is coupled to receive the input at a second input node and provide a second output at a second output node, wherein the LSC is configured to provide an output at an output node in response to the first output received at the first output node and the second output received at the second output node;
a first power source configured to provide a first power supply voltage to the LSC, the FCC and the SCC, wherein the output is latched to track the input, wherein the LSC, the FCC and the SCC are coupled to a ground reference node; and
a second power source configured to provide the second power supply voltage to the FCC and the SCC, wherein the FCC is coupled to receive the inverse of the input at the first input node and configured to switch the first output between the first power supply voltage and the ground reference node voltage in response to the inverse of the input switching between the ground reference node voltage and the second power supply voltage, wherein the SCC is configured to receive the input at the second input node.

12. A method comprising:
configuring a first power source to provide a first power supply voltage;
configuring a second power source to provide a second power supply voltage, wherein the second power source provides a lower power supply voltage compared to the first power source;
configuring a first control circuit (FCC) to shift a voltage level of an inverse of an input operating between the second power supply voltage and a ground reference to a first output operating between the first power supply voltage and the ground reference, wherein the FCC comprises
a third (MN3) n-channel transistor having a gate coupled to receive the inverse of the input at the first input node, wherein an operating state of the MN3 transistor is switched in response to the inverse of the input;
a pair of fifth (MP5) and sixth (MP6) p-channel transistors coupled in series, wherein respective gates of the MP5 and MP6 transistors are coupled to receive the inverse of the input at the first input node, wherein a drain of the MP6 transistor is coupled to a drain of the MN3 transistor to form the first output node;
a third (MP3) p-channel transistor having a gate coupled to receive the second output at the second output node, wherein a source of the MP3 transistor is coupled to the first power source, wherein a drain of the MP3 transistor is coupled to a source of the MP5 transistor; and
a fifth (MN5) n-channel transistor having a gate coupled to receive the input at the third input node, wherein a source of the MN5 transistor is coupled to the first output node, wherein a drain of the MN5 transistor is coupled to the second power source;
configuring a second control circuit (SCC) to shift the voltage level of the input to a second output operating between the first power supply voltage and the ground reference, wherein the second output is an inverse of the first output; and
configuring a level shifter circuit (LSC) to receive the first output and the second output and generate an output, wherein the output is operable to track the input, the output operating between the first power supply voltage and the ground reference.

13. The method of claim 12, wherein the shift in the voltage level is sufficient to exceed a threshold voltage of an input pair of transistors of the LSC, the input pair of transistors being coupled to the first output and the second output.

14. The method of claim 13 further comprising:
matching a drive strength of the input pair of transistors and a cross-coupled pair of transistors of the LSC to reduce voltage stress on the input pair of transistors.

15. The method of claim 12, wherein the LSC comprises:
a pair of cross-coupled first (MP1) and second (MP2) p-channel transistors, wherein a gate of the MP1 transistor is coupled to the output node, wherein a gate of the MP2 transistor is coupled to a drain of the MP1 transistor, wherein a source of the MP1 and MP2 transistors is coupled to the first power source; and
a differential pair of first (MN1) and second (MN2) re-channel transistors, wherein
the MN1 transistor having a gate coupled to receive the first output at the first output node, wherein a source of the MN1 transistor is coupled to the ground reference node, wherein a drain of the MN1 transistor is coupled to a drain of the MP1 transistor, and
the MN2 transistor having a gate coupled to receive the second output at the second output node, wherein a source of the MN2 transistor is coupled to the ground reference node, wherein a drain of the MN2 transistor is coupled to a drain of the MP2 transistor.

16. The method of claim 15, wherein the second power supply voltage is configured to be at least equal to a threshold voltage of the MN3 transistor, wherein the MN5 transistor is configured to speed up response of the output in response to a change in the input.

17. The method of claim 12, wherein the SCC further comprises:
a fourth (MN4) n-channel transistor having a gate coupled to receive the input at the second input node, wherein an operating state of the MN4 transistor is switched in response to the input;
a pair of seventh (MP7) and eighth (MP8) p-channel transistors coupled in series, wherein respective gates of the MP7 and MP8 transistors are coupled to receive the input at the second input node, wherein a drain of the MP8 transistor is coupled to a drain of the MN4 transistor to form the second output node;
a fourth (MP4) p-channel transistor having a gate coupled to receive the first output at the first output node, wherein a source of the MP4 transistor is coupled to the first power source, wherein a drain of the MP4 transistor is coupled to a source of the MP7 transistor; and
a sixth (MN6) n-channel transistor having a gate coupled to receive the inverse of the input at the fourth input node, wherein a source of the MN6 transistor is coupled to the second output node, wherein a drain of the MN6 transistor is coupled to the second power source.

18. The method of claim 17, wherein the second power supply voltage is configured to be at least equal to a threshold voltage of the MN4 transistor, wherein the MN6 transistor is configured to speed up response of the output in response to a change in the input.

19. A method comprising:
configuring a first control circuit (FCC) to shift a voltage level of an inverse of an input operating between a second power supply voltage and a ground reference to a first output operating between a first power supply voltage and the ground reference;
configuring a second control circuit (SCC) to shift the voltage level of the input to a second output operating between the first power supply voltage and the ground reference, wherein the second output is an inverse of the first output;
configuring a level shifter circuit (LSC) to receive the first output and the second output and generate an output, wherein the output is operable to track the input, the output operating between the first power supply voltage and the ground reference;
configuring a first power source to provide the first power supply voltage to the LSC, the FCC and the SCC; and
configuring a second power source to provide the second power supply voltage to the FCC, the SCC and an inverter configured to generate the inverse of the input.

* * * * *